United States Patent
Yamazaki et al.

(10) Patent No.: US 8,988,170 B2
(45) Date of Patent: Mar. 24, 2015

(54) ELASTIC WAVE FILTER DEVICE AND COMMUNICATION APPARATUS EQUIPPED WITH THE SAME

(71) Applicant: Murata Manufacturing Co., Ltd., Nagaokakyo-shi, Kyoto-fu (JP)

(72) Inventors: Sunao Yamazaki, Nagaokakyo (JP); Katsuhito Kuroda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 76 days.

(21) Appl. No.: 13/890,284

(22) Filed: May 9, 2013

(65) Prior Publication Data

US 2013/0241674 A1      Sep. 19, 2013

Related U.S. Application Data

(63) Continuation of application No. PCT/JP2011/071740, filed on Sep. 23, 2011.

(30) Foreign Application Priority Data

Dec. 29, 2010   (JP) ................. 2010-294524

(51) Int. Cl.
*H03H 9/72*      (2006.01)
*H03H 9/64*      (2006.01)

(52) U.S. Cl.
CPC ............... *H03H 9/64* (2013.01); *H03H 9/6483* (2013.01)
USPC .......................................... 333/187; 333/133

(58) Field of Classification Search
CPC .................... H03H 9/72; H03H 9/64
USPC .......................... 333/133, 193, 194, 195, 196
See application file for complete search history.

(56) References Cited

U.S. PATENT DOCUMENTS

| | | | |
|---|---|---|---|
| 7,049,908 B2 * | 5/2006 | Takata | 333/193 |
| 7,696,842 B2 * | 4/2010 | Uejima et al. | 333/133 |
| 8,183,958 B2 * | 5/2012 | Fujita | 333/133 |
| 2003/0006859 A1 | 1/2003 | Taniguchi | |
| 2006/0186755 A1 | 8/2006 | Mori et al. | |
| 2007/0190954 A1 | 8/2007 | Murakami et al. | |
| 2008/0024243 A1 | 1/2008 | Iwaki et al. | |
| 2008/0055021 A1 | 3/2008 | Ueda et al. | |

(Continued)

FOREIGN PATENT DOCUMENTS

| | | |
|---|---|---|
| JP | 07-273597 A | 10/1995 |
| JP | 10-335977 A | 12/1998 |

(Continued)

OTHER PUBLICATIONS

Official Communication issued in International Patent Application No. PCT/JP2011/071740, mailed on Dec. 6, 2011.

*Primary Examiner* — Dean Takaoka
(74) *Attorney, Agent, or Firm* — Keating & Bennett, LLP

(57) ABSTRACT

An elastic wave filter device has a center frequency of a reception frequency band. A plurality of parallel arms are connected to a portion of a series arm on a second signal terminal side of a portion in which a first series-arm resonator is provided. Series-arm resonators among the plurality of series-arm resonators other than the first series-arm resonator include a series-arm resonator having a resonant frequency higher than the resonant frequency of the first series-arm resonator. The resonant frequency of the first series-arm resonator is equal to the reception frequency band.

19 Claims, 2 Drawing Sheets

(56) References Cited

U.S. PATENT DOCUMENTS

| | | | |
|---|---|---|---|
| 2009/0201104 A1* | 8/2009 | Ueda et al. | 333/195 |
| 2009/0315640 A1 | 12/2009 | Umeda et al. | |

FOREIGN PATENT DOCUMENTS

| | | |
|---|---|---|
| JP | 2002-330054 A | 11/2002 |
| JP | 2003-087096 A | 3/2003 |
| JP | 2006-135921 A | 5/2006 |
| JP | 2006-238014 A | 9/2006 |
| JP | 2007-336479 A | 12/2007 |
| JP | 2008-085989 A | 4/2008 |
| JP | 2009-206719 A | 9/2009 |
| JP | 2010-010832 A | 1/2010 |
| WO | 2005/088833 A1 | 9/2005 |
| WO | 2010/103882 A1 | 9/2010 |

* cited by examiner

ELASTIC WAVE FILTER DEVICE AND COMMUNICATION APPARATUS EQUIPPED WITH THE SAME

BACKGROUND OF THE INVENTION

1. Field of the Invention

The present invention relates to an elastic wave filter device and to a communication apparatus equipped with an elastic wave filter device. In particular, the present invention relates to a ladder-type elastic wave filter device and to a communication apparatus equipped with a ladder-type elastic wave filter device.

2. Description of the Related Art

In recent years, with the increasing functionality of mobile communication apparatuses such as cellular phones, it has become increasingly common to mount, for example, GPS (global positioning system) and WLAN (wireless local area network) elastic wave filter devices, in addition to elastic wave filter devices for mobile communication, in communication apparatuses.

In a communication apparatus that includes such a plurality of elastic wave filter devices, intermodulation distortion (IMD) is generated in some of the elastic wave filter devices due to a non-linear effect exhibited by the elastic wave filter devices and as a result the filter characteristics are degraded. For example, sometimes a signal of a certain elastic wave filter device and a signal of another elastic wave filter device are input to yet another elastic wave filter device through antennas. In such a case, in the yet another elastic wave filter device, a combined signal is generated at a frequency that depends on the sum of or the difference between the frequency of the signal of the certain elastic wave filter device and the frequency of the signal of the other elastic wave filter device. In the case where the frequency of the combined signal is within the passband of the yet another elastic wave filter device, the filter characteristics of the yet another elastic wave filter device are degraded. Specifically, in a communication apparatus that includes a WLAN elastic wave filter device, a GPS elastic wave filter device and a mobile communication elastic wave filter device for use in UMTS BAND 5, 6, or 8 or GSM-900 or GSM-850, since the difference between a signal of the WLAN elastic wave filter device (2400 to 2500 MHz) and a signal of the mobile communication elastic wave filter device (800 to 1000 MHz) coincides with a center frequency of signals of the GPS elastic wave filter device (1575, 42 MHz), the filter characteristics of the GPS elastic filter device are degraded due to IMD.

A method of suppressing generation of IMD is, for example, a method in which a series-arm resonator positioned closest to the antenna is divided into a plurality of parts, as described in Japanese Unexamined Patent Application Publication No. 2008-85989. The non-linear effect of a filter has a strong correlation with input electrical power. Accordingly, the higher the electrical power of a load is, the larger the non-linear effect becomes and therefore the more likely generation of IMD becomes. By dividing the series-arm resonator positioned closest to the antenna into a plurality of parts, the area of the series-arm resonator can be increased and the power consumption per unit area can be reduced. As a result, generation of IMD can be suppressed.

In addition, another method for suppressing generation of IMD for example is a method in which a capacitor and an inductor are connected in parallel between a transmission/reception filter and an antenna as described in Japanese Unexamined Patent Application Publication No. 2007-336479.

However, there is a problem in that, when a series-arm resonator is divided into a plurality of parts or a capacitor and an inductor are connected in parallel with each other, the elastic wave filter device is increased in size.

SUMMARY OF THE INVENTION

Preferred embodiments of the present invention significantly reduce or prevent generation of IMD in an elastic wave filter device including a plurality of elastic wave filter units without increasing the size of the elastic wave filter device.

An elastic wave filter device according to a preferred embodiment of the present invention has a center frequency of a reception frequency band of $f_{F2}$. The elastic wave filter device according to a preferred embodiment of the present invention includes a first signal terminal connected to an antenna, a second signal terminal, a series arm, a plurality of series-arm resonators, a plurality of parallel arms, and a parallel-arm resonator. The series arm connects the first signal terminal and the second signal terminal. The plurality of series-arm resonators are connected in series with one another in the series arm. The plurality of parallel arms connect the series arm and a ground potential. A parallel-arm resonator is provided in each of the plurality of parallel arms. The plurality of series-arm resonators includes a first series-arm resonator that is positioned closest to the first signal terminal. The plurality of parallel arms are connected to a portion of the series arm on the second-signal-terminal side of the portion in which first series-arm resonator is provided. Series-arm resonators among the plurality of series-arm resonators other than the first series-arm resonator include a series-arm resonator having a resonant frequency higher than the resonant frequency of the first series-arm resonator. The resonant frequency of the first series-arm resonator is equal to $f_{F2}$.

In the description of preferred embodiments of the present invention, it is assumed that the term "elastic wave" encompasses surface acoustic waves and boundary acoustic waves. Accordingly, in preferred embodiments of the present invention, the elastic wave filter device may be a surface acoustic wave filter device or a boundary acoustic wave filter device.

The phrase "resonant frequency is equal to reception frequency" as included in this description means that the resonant frequency is within a range of the reception frequency of about ±2 Mz, for example.

In a certain specific preferred embodiment of the elastic wave filter device according to the present invention, the elastic wave filter device is a filter device for receiving a GPS signal, for example.

A communication apparatus according to a preferred embodiment of the present invention includes a first filter device having a transmission frequency band of $\Delta f_{F1}$, a second elastic wave filter device having a reception frequency band of $\Delta f_{F2}$, and a third filter device having a transmission frequency band of $\Delta f_{F3}$, where $\Delta f_{F1} > \Delta f_{F2} > \Delta f_{F3}$. $\Delta f_{F2}$ is larger than the minimum value of the difference between $\Delta f_{F1}$ and $\Delta f_{F3}$ and smaller than the maximum value of the difference between $\Delta f_{F1}$ and $\Delta f_{F3}$. The second elastic wave filter device is produced using the above-described elastic wave filter device according to a preferred embodiment of the present invention.

In a certain communication apparatus according to a specific preferred embodiment of the present invention, the first filter device preferably is a filter device for WLAN, for example.

According to preferred embodiments of the present invention, the generation of IMD can be significantly reduced or prevented while not increasing the size of an elastic wave filter device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described while taking a communication apparatus 1 illustrated in FIG. 1 as a non-limiting example. However, the communication apparatus 1 is simply an illustrative example. The present invention is in no way limited to the communication apparatus 1.

Figure 1:
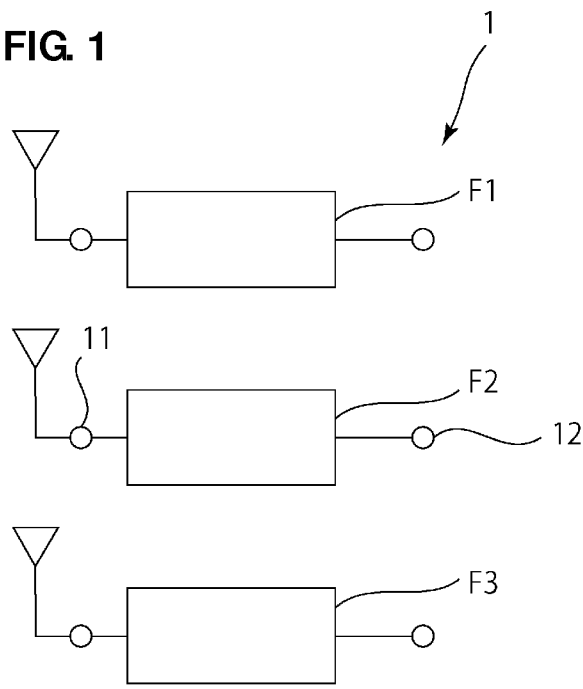
FIG. 1 is a schematic view of a communication apparatus according to a preferred embodiment of the present invention.
Figure 2:
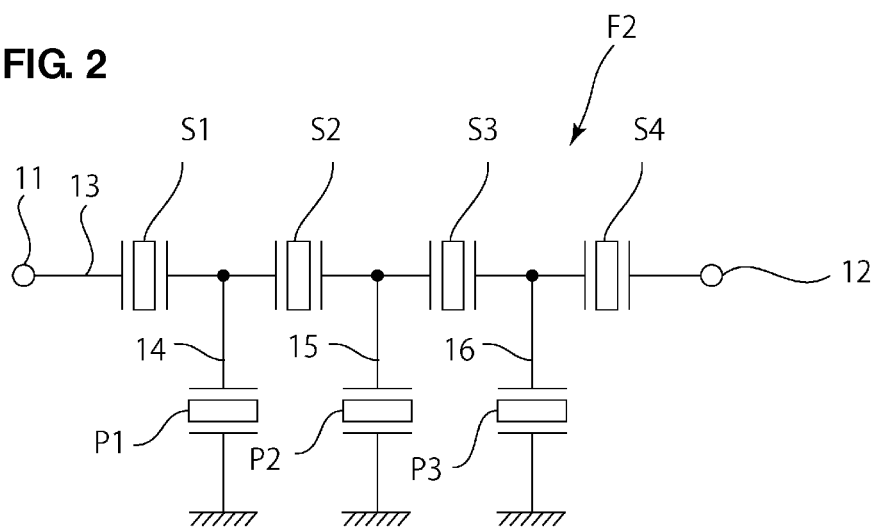
FIG. 2 is a schematic circuit diagram of a second elastic wave filter device according to a preferred embodiment of the present invention.

FIG. 1 is a schematic view of a communication apparatus according to the present preferred embodiment. FIG. 2 is a schematic circuit diagram of an elastic wave filter device used as a second filter device in this preferred embodiment. As illustrated in FIG. 1, the communication apparatus 1 preferably includes a plurality of filter devices F1 to F3, which are connected to different antennas. The transmission frequency band of the filter device F1 is $\Delta f_{F1}$. The reception frequency band of the filter device F2 is $\Delta f_{F2}$. The transmission frequency band of the filter device F3 is $\Delta f_{F3}$. Here, $\Delta f_{F1}$, $\Delta f_{F2}$ and $\Delta f_{F3}$ satisfy the following conditions (1) and (2).

(1) $\Delta f_{F1} > \Delta f_{F2} > \Delta f_{F3}$.

(2) (a minimum value of difference between $\Delta f_{F1}$ and $\Delta f_{F3}$) $< \Delta f_{F2} <$ (a maximum value of difference between $\Delta f_{F1}$ and $\Delta f_{F3}$).

Specifically, in this preferred embodiment, the filter device F1 is preferably a filter device used in a WLAN (wireless local area network), for example. Consequently, the transmission frequency band $\Delta f_{F1}$ of the filter device F1 is preferably about 2400 MHz to about 2500 MHz, for example. The filter device F2 is preferably a filter device used in receiving a GPS (global positioning system) signal, for example. Accordingly, the reception frequency band $\Delta f_{F2}$ of the filter device F2 is the range of about 1575.42 MHz±1.023 MHz, for example. The elastic wave filter device F3 is preferably a filter device used in mobile communication, for example. More specifically, the filter device F3 is preferably a BAND 5, 6, or 8 filter device, for example. Accordingly, the transmission frequency band $\Delta f_{F3}$ of the filter device F3 is about 800 MHz to about 1000 MHz, for example.

Thus, in this preferred embodiment, since the above conditions (1) and (2) are satisfied, the difference between the transmission frequency band $\Delta f_{F1}$ of the elastic wave filter device F1 and the transmission frequency band $\Delta f_{F3}$ of the elastic wave filter device F3 may be equal to the reception frequency $f_{F2}$ of the filter device F2. Therefore, in the case where the filter device F2 is an elastic wave filter device such as, for example, a surface acoustic wave filter or a piezoelectric thin film resonator filter having a non-linear effect, there is a concern that when a transmission signal of the filter device F1 and a transmission signal of the filter device F3 enter the elastic wave filter device F2, IMD will be generated inside the reception frequency band $\Delta f_{F2}$ of the elastic wave filter device F2 and as a result reception sensitivity will be degraded.

Similarly to the filter device F2, the filter devices F1 and F3 may be elastic wave filter devices, or may instead be another kind of filter device such as, for example, a dielectric filter device or an LC filter device.

The elastic wave filter device F2 preferably has a ladder-type circuit configuration as illustrated in FIG. 2. The elastic wave filter device F2 preferably includes an input signal terminal 11, which is connected to an antenna, and an output signal terminal 12, which is connected to a downstream circuit. The input signal terminal 11 and the output signal terminal 12 are preferably connected to each other via a series arm 13. In the series arm 13, a plurality of series-arm resonators S1 to S4 are connected in series with each other. Among the series-arm resonators S1 to S4, the series-arm resonator S1 is positioned closest to the input signal terminal 11 and thus is closest to the antenna. The series arm 13 and a ground potential are preferably connected to each other though a plurality of parallel arms 14 to 16. Parallel arm resonators P1 to P3 are respectively connected to the plurality of parallel arms 14 to 16. In the present preferred embodiment, a series-arm resonator and a parallel-arm resonator may each be defined by a single resonator or may each be defined by a plurality of resonators that function as a single resonator.

The plurality of parallel arms 14 to 16 are connected to a portion of the series arm 13 on an output signal terminal 12 side of a portion to which the series-arm resonator S1 is connected. That is, preferably no parallel arm is connected on the input signal terminal 11 side of the portion of series arm 13 to which the series-arm resonator S1 is connected.

Figure 3:
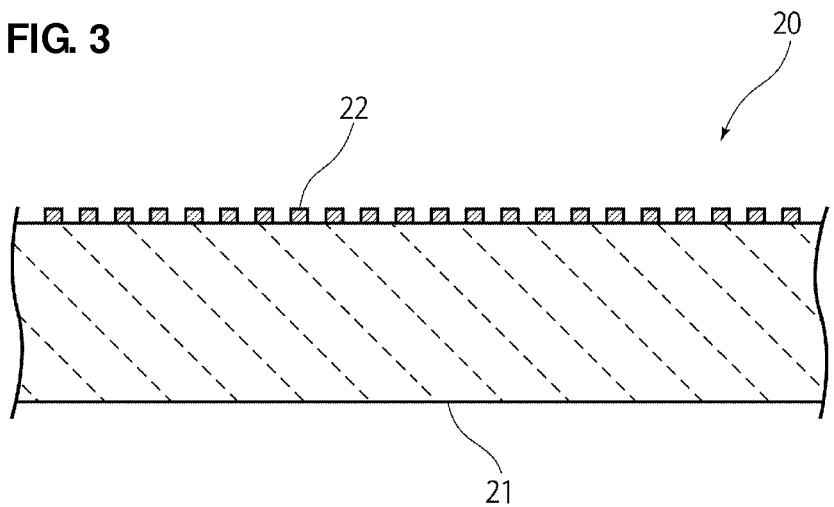
FIG. 3 is a schematic sectional view of a surface acoustic wave resonator according to a preferred embodiment of the present invention.

In this preferred embodiment, resonators that define the series-arm resonators and the parallel-arm resonators are each provided by a surface acoustic wave resonator 20 illustrated in FIG. 3. The surface acoustic wave resonator 20 preferably includes a piezoelectric substrate 21, an IDT (inter-digital transducer) electrode 22 arranged on the piezoelectric substrate 21, and a pair of reflectors (not illustrated) that are provided at either side of the IDT electrode 22. The piezoelectric substrate 21, for example, can be made of, for example, $LiNbO_3$, $LiTaO_3$ or quartz. The IDT electrode 22, for example, can be made of a metal selected from the group of Al, Pt, Au, Ag, Cu, Ni, Ti, Cr and Pd, or an alloy containing at least one metal selected from the group of Al, Pt, Au, Ag, Cu, Ni, Ti, Cr and Pd. The IDT electrode 22 can be made of a laminate of a plurality of conductive films of a metal or alloy described above.

Among the plurality of series-arm resonators S1 to S4, the series-arm resonators S2 to S4, other than the series-arm resonator S1, preferably have a resonant frequency that is higher than the resonant frequency of the series-arm resonator S1. In the basic design of a ladder-type circuit configuration, the resonant frequency of a series-arm resonator and the anti-resonant frequency of a parallel-arm resonator preferably are made to coincide with a center frequency of the pass band. However, in reality, the required magnitude of attenuation and passband width cannot be realized with just this basic design. Accordingly, desired filter characteristics are obtained by shifting the resonant frequency of a series-arm resonator or the anti-resonant frequency of a parallel-arm resonator away from the center frequency of the pass band. Also in this preferred embodiment, the series-arm resonators S2 to S4, other than the series-arm resonator S1, preferably have a resonant frequency that is higher than the center frequency of the pass band. Thus, attenuation in the vicinity of the high side of the pass band is increased.

In this preferred embodiment, the resonant frequency of the series-arm resonator S1, which is closest to the antenna, is preferably the same as the center frequency $f_{F2}$ of the reception frequency band of the elastic wave filter device F2. Consequently, the impedance of the series-arm resonator S1 at the center frequency $f_{F2}$ is minimized and therefore power consumption is reduced. Therefore, in the vicinity of the center frequency $f_{F2}$, the generation of IMD is significantly reduced or prevented.

For example, in the case where a series-arm resonator is a surface acoustic wave resonator, it has been considered that the power consumption per unit area of the IDT electrode will be reduced by the IDT electrode being divided into a plurality of parts. However, when a series-arm resonator is divided into, for example, two parts, the area of the series-arm resonator becomes four times as large. Accordingly, the elastic wave filter device is increased in size. In addition, in the case where an inductor and a capacitor are provided to suppress generation of IMD, the elastic filter device is also increased in size.

In contrast, in the present preferred embodiment of the present invention, the power consumption per unit area of the IDT electrode is decreased by making the resonant frequency of the series-arm resonator S1 coincide with the reception frequency $f_{F2}$ of the elastic wave filter device F2. Accordingly, there is no need to divide the series-arm resonator S1 into a plurality of resonators. In addition, there is no need to provide an inductor or capacitor to suppress IMD. Therefore, the generation of IMD can be effectively reduced or prevented without increasing the size of the elastic wave filter device F2.

Hereafter, this effect will be explained in detail using examples.

The elastic wave filter device F2 of example 1 preferably includes the circuit configuration illustrated in FIG. 2, similarly to as in the above-described preferred embodiment, and the resonators S1 to S4 and P1 to P3 are surface acoustic wave resonators. The IDT electrodes of the resonators S1 to S4 and P1 to P3 were manufactured using the following non-limiting examples of design parameters:

Intersection widths of IDT electrodes of series-arm resonators:
S1: 30 µm, S2: 30 µm, S3: 30 µm, S4: 174 µm Intersection widths of IDT electrodes of parallel-arm resonators:
P1: 161 µm, P2: 138 µm, P3: 175 µm Number of pairs of IDT electrodes of series-arm resonators:
S1: 71 pairs, S2: 43 pairs, S3: 43 pairs, S4: 110 pairs Number of pairs of IDT electrodes of parallel-arm resonators:
P1: 72 pairs, P2: 73 pairs, P3: 68 pairs Wavelengths of IDT electrodes of series-arm resonators:
S1: 2.453 µm, S2: 2.444 µm, S3: 2.446 µm, S4: 2.438 µm Wavelengths of IDT electrodes of parallel-arm resonators:
P1: 2.530 µm, P2: 2.534 µm, P3: 2.535 µm Duty ratios of IDT electrodes of series-arm resonators:
S1: 0.6, S2: 0.6, S3: 0.6 µm, S4: 0.6 µm Duty ratios of IDT electrodes of parallel-arm resonators:
P1: 0.7 µm, P2: 0.7 µm, P3: 0.7 µm In the above example, the resonant frequency of the series-arm resonator S1 is set to 1575.42 MHz, which coincides with the center frequency of the GPS reception frequency band.

The resonant frequencies of the other series-arm resonators are as follows: S2 is 1581.10 MHz, S3 is 1580.00 MHz and S3 is 1579.30 MHz. The resonant frequency of the series-arm resonator S1 was changed by 1 MHz each time and IMD was measured. The obtained results are illustrated in Table 1.

TABLE 1

| Frequency | IMD |
|---|---|
| 1585.42 | −82.10 |
| 1584.42 | −83.09 |
| 1583.42 | −84.41 |
| 1582.42 | −85.73 |
| 1581.42 | −87.22 |
| 1580.42 | −88.72 |
| 1579.42 | −89.78 |
| 1578.42 | −90.84 |
| 1577.42 | −91.42 |
| 1576.42 | −92.00 |
| 1575.42 | −92.39 |
| 1574.42 | −92.78 |
| 1573.42 | −91.44 |
| 1572.42 | −90.10 |
| 1571.42 | −89.45 |
| 1570.42 | −88.80 |
| 1569.42 | −88.60 |
| 1568.42 | −88.41 |
| 1567.42 | −88.09 |
| 1566.42 | −87.78 |
| 1565.42 | −87.36 |

It is clear from Table 1 that generation of IMD can be more greatly reduced and prevented the closer the resonant frequency of the series-arm resonator S1 is to 1575.42 MHz, which is the center frequency of the GPS reception frequency band. Specifically, in the range of 1575.42 MHz±2 MHz, IMD is equal to or less than −91 dBm such that generation of IMD can be sufficiently reduced and prevented. Furthermore, in the range of 1575.42 MHz±1 MHz, IMD is −92 dBm or less such that generation of IMD can be sufficiently reduced and prevented as in the case where the resonant frequency of the series-arm resonator S1 is 1575.42 MHz.

In the above-described example, the elastic wave filter devices preferably are surface acoustic wave filter devices, for example. However, preferred embodiments of the present invention are not limited to this configuration. The elastic wave filter devices according to preferred embodiments of the present invention may be boundary acoustic wave filter devices or bulk acoustic wave filter devices. A communication apparatus according to preferred embodiments of the present invention may be a communication apparatus in which surface acoustic waves are utilized, may be a communication apparatus in which boundary acoustic waves are utilized or may be a communication apparatus in which bulk acoustic waves are utilized.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A communication apparatus comprising:
a first filter device in which a transmission frequency band is $\Delta f_{F1}$;
a second elastic wave filter device in which a reception frequency band is $\Delta f_{F2}$; and
a third filter device in which a transmission frequency band is $\Delta f_{F3}$; wherein $\Delta f_{F1} > \Delta f_{F2} > \Delta f_{F3}$;

$\Delta f_{F2}$ is larger than a minimum value of the difference between $\Delta f_{F1}$ and $\Delta f_{F3}$ and is smaller than a maximum value of the difference between $\Delta f_{F1}$ and $\Delta f_{F3}$;

the second elastic wave filter device comprises:
- a first signal terminal connected to an antenna;
- a second signal terminal;
- a series arm that connects the first signal terminal and the second signal terminal;
- a plurality of series-arm resonators connected in series with one another in the series arm;
- a plurality of parallel arms that connect the series arm and a ground potential; and
- a parallel-arm resonator provided in each of the plurality of parallel arms; wherein
- the plurality of series-arm resonators includes a first series-arm resonator that is positioned closest to the first signal terminal among the plurality of series-arm resonators;
- the plurality of parallel arms are connected to a portion of the series arm on a second signal terminal side of a portion in which first series-arm resonator is provided;
- series-arm resonators among the plurality of series-arm resonators other than the first series-arm resonator include a series-arm resonator having a resonant frequency higher than a resonant frequency of the first series-arm resonator; and
- the resonant frequency of the first series-arm resonator is equal to a reception frequency band of the second elastic wave filter device; and the first filter device, the second filter device, and the third filter device are connected to different antennas.

2. The communication apparatus according to claim 1, wherein the second elastic wave filter device is a filter device that receives a global positioning system signal.

3. The communication apparatus according to claim 1, wherein the first filter device is a wireless local area network filter device.

4. A communication apparatus comprising:
- a first filter device in which a transmission frequency band is $\Delta f_{F1}$;
- a second elastic wave filter device in which a reception frequency band is $\Delta f_{F2}$; and
- a third filter device in which a transmission frequency band is $\Delta f_{F3}$; wherein $\Delta f_{F1} > \Delta f_{F2} > \Delta f_{F3}$;
- $\Delta f_{F2}$ is larger than a minimum value of the difference between $\Delta f_{F1}$ and $\Delta f_{F3}$ and is smaller than a maximum value of the difference between $\Delta f_{F1}$ and $\Delta f_{F3}$;
- the second elastic wave filter device comprises:
  - a first signal terminal connected to an antenna;
  - a second signal terminal;
  - a series arm that connects the first signal terminal and the second signal terminal;
  - a plurality of series-arm resonators connected in series with one another in the series arm;
  - a plurality of parallel arms that connect the series arm and a ground potential; and
  - a parallel-arm resonator provided in each of the plurality of parallel arms; wherein
  - the plurality of series-arm resonators includes a first series-arm resonator that is positioned closest to the first signal terminal among the plurality of series-arm resonators;
  - the plurality of parallel arms are connected to a portion of the series arm on a second signal terminal side of a portion in which first series-arm resonator is provided;
  - series-arm resonators among the plurality of series-arm resonators other than the first series-arm resonator include a series-arm resonator having a resonant frequency higher than a resonant frequency of the first series-arm resonator; and
  - the resonant frequency of the first series-arm resonator is equal to a reception frequency band of the second elastic wave filter device; and
- the first filter device is a wireless local area network filter device.

5. The communication apparatus according to claim 4, wherein the second filter device is a filter device that receives a global positioning satellite signal.

6. The communication apparatus according to claim 4, wherein the reception frequency band $\Delta f_{F2}$ is about 1575.42 MHz±1.023 MHz.

7. The communication apparatus according to claim 4, wherein the third filter device is a BAND 5, 6, or 8 filter device and the transmission frequency band $\Delta f_{F3}$ is about 800 MHz to about 1000 MHz.

8. The communication apparatus according to claim 4, wherein no parallel arm is connected on an input signal terminal side of a portion of series arm to which the first series-arm resonator is connected.

9. The communication apparatus according to claim 4, wherein the plurality of series-arm resonators and the plurality of parallel-arm resonators are all provided by a surface acoustic wave resonator.

10. The communication apparatus according to claim 9, wherein the surface acoustic wave resonator includes a piezoelectric substrate, an inter-digital transducer electrode arranged on the piezoelectric substrate, and a pair of reflectors that are provided at either side of the inter-digital transducer electrode.

11. The communication apparatus according to claim 4, wherein the plurality of series-arm resonators and the plurality of parallel-arm resonators are all provided by a boundary acoustic wave resonator.

12. The communication apparatus according to claim 4, wherein the plurality of series-arm resonators and the plurality of parallel-arm resonators are all provided by a bulk acoustic wave resonator.

13. The communication apparatus according to claim 4, wherein the plurality of parallel arms includes three parallel arms.

14. The communication apparatus according to claim 4, wherein
- the transmission frequency band $\Delta f_{F1}$ is about 2400 MHz to about 2500 MHz;
- the reception frequency band $\Delta f_{F2}$ is about 1575.42 MHz±1.023 MHz; and
- the transmission frequency band $\Delta f_{F3}$ is about 800 MHz to about 1000 MHz.

15. The communication apparatus according to claim 4, wherein the first filter device and the third filter device are elastic wave filter devices, dielectric filter devices, or LC filter devices.

16. The communication apparatus according to claim 4, wherein each of the plurality of parallel arms is connected directly between two respective series-arm resonators of the plurality of series-arm resonators.

17. The communication apparatus according to claim 4, wherein the second signal terminal is an output signal terminal connected to a downstream circuit.

18. The communication apparatus according to claim 4, wherein the plurality of series-arm resonators includes four series-arm resonators.

19. A communication apparatus comprising:
a first filter device in which a transmission frequency band is $\Delta f_{F1}$;
a second elastic wave filter device in which a reception frequency band is $\Delta f_{F2}$; and
a third filter device in which a transmission frequency band is $\Delta f_{F3}$; wherein $\Delta f_{F1} > \Delta f_{F2} > \Delta f_{F3}$;
$\Delta f_{F2}$ is larger than a minimum value of the difference between $\Delta f_{F1}$ and $\Delta f_{F3}$ and is smaller than a maximum value of the difference between $\Delta f_{F1}$ and $\Delta f_{F3}$;
the second elastic wave filter device comprises:
- a first signal terminal connected to an antenna;
- a second signal terminal;
- a series arm that connects the first signal terminal and the second signal terminal;
- a plurality of series-arm resonators connected in series with one another in the series arm;
- a plurality of parallel arms that connect the series arm and a ground potential; and
- a parallel-arm resonator provided in each of the plurality of parallel arms; wherein the plurality of series-arm resonators includes a first series-arm resonator that is positioned closest to the first signal terminal among the plurality of series-arm resonators;

the plurality of parallel arms are connected to a portion of the series arm on a second signal terminal side of a portion in which first series-arm resonator is provided;

series-arm resonators among the plurality of series-arm resonators other than the first series-arm resonator include a series-arm resonator having a resonant frequency higher than a resonant frequency of the first series-arm resonator; and the resonant frequency of the first series-arm resonator is equal to a reception frequency band of the second elastic wave filter device; and the second filter device is a surface acoustic wave filter or a piezoelectric thin film resonator filter having a nonlinear effect.

* * * * *